(12) United States Patent
Arata et al.

(10) Patent No.: US 6,462,147 B1
(45) Date of Patent: Oct. 8, 2002

(54) EPOXY RESIN COMPOSITIONS FOR PRINTED CIRCUIT BOARD AND PRINTED CIRCUIT BOARD USING THE SAME

(75) Inventors: Michitoshi Arata, Shimodate; Nozomu Takano, Yuuki; Tomio Fukuda; Kenichi Tomioka, both of Shimodate, all of (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/274,100

(22) Filed: Mar. 23, 1999

(30) Foreign Application Priority Data

Mar. 27, 1998 (JP) .............................. 10-081146

(51) Int. Cl.⁷ .............................. C08F 283/00
(52) U.S. Cl. .................. 525/486; 428/901; 428/413; 428/416
(58) Field of Search .................. 525/486; 428/901, 428/413, 416

(56) References Cited

U.S. PATENT DOCUMENTS

| 4,393,181 A | * | 7/1983 | Allen | 525/504 |
| 4,661,568 A | * | 4/1987 | Koenig et al. | 525/486 |
| 4,734,332 A | * | 3/1988 | Bagga et al. | 428/414 |
| 4,959,400 A | * | 9/1990 | Sexton | 525/486 |
| 6,133,377 A | * | 10/2000 | Nakamura et al. | 428/413 |

FOREIGN PATENT DOCUMENTS

| EP | 559607 | * | 9/1993 |
| EP | 728789 | * | 8/1996 |
| JP | 54-48879 | | 4/1979 |
| JP | 08-253558 | * | 10/1996 |

* cited by examiner

*Primary Examiner*—Philip Tucker
(74) *Attorney, Agent, or Firm*—Crowell & Moring LLP

(57) ABSTRACT

An epoxy resin composition for a printed circuit board includes an epoxy resin; a multi-functional phenol group; a hardening accelerator; and at least one of a compound having a triazine or isocyanurate ring, and a compound containing less than 60 weight percent nitrogen, but not containing a urea derivative. A printed circuit board comprising the epoxy resin composition has low water absorption, excellent heat endurance, and a good adhesion with copper foil.

13 Claims, No Drawings

EPOXY RESIN COMPOSITIONS FOR PRINTED CIRCUIT BOARD AND PRINTED CIRCUIT BOARD USING THE SAME

FIELD OF THE INVENTION

The present invention relates to epoxy resin compositions suitable for printed circuit boards and printed circuit boards using the same.

DESCRIPTION OF RELATED ART

With an increasing demand for more compactness and high performance of electronics devices, a higher density packaging of printed circuit boards to be included therein is progressing by provisions of multilayered and thin film lamination, a reduced diameter of plated throughholes, a narrow gap between holes and the like. Further, for printed circuit boards to be mounted in information terminal equipment such as a cellular phone, a mobile computer and so on, which requires plastic packaging directly to mount a MPU on its printed circuit board, or on other types of printed circuit boards suitable for various types of modules, it is demanded to be able to process a large quantity of information at a higher speed, thereby requiring a faster signal processing speed, a lower transmission loss, and further down-sizing in the components and system. Therefore, a finer pattern wiring is demanded more than ever with the trend for the higher density electronic packaging.

A substantially improved material having an excellent heat endurance and a high Tg is demanded for such printed circuit boards and those for a module which mount MPUs thereon in order for the reliability of their circuit connections to be ensured fully. However, because conventional resin materials having a high Tg tend to be mechanically hard and brittle, there is such a disadvantage that they have a low adhesiveness with a copper foil. Any resin material having a low adhesion with the copper foil tends to cause a peel-off and /or disconnection of wiring during molding and packaging of a substrate. Therefore, the adhesion property with the copper foil will become more vital with an advancing finer pattern wiring technique.

Conventional printed circuit boards using an epoxy resin group which is cured with dicyandiamide have been widely used. However, this epoxy resin group cured with dicyandiamide has a disadvantage that its hygroscopic property tends to increase. Therefore, it is becoming difficult to satisfy an increasing insulation reliability required for realizing a next-generation printed circuit board having a higher packaging density.

In contrast, a group which uses a multifunctional phenol resin as its curing agent has a low water absorption, and can provide for a printed circuit board having a Tg higher than 170° C. However, as mentioned previously, the resin material having a high Tg is hard and brittle, and still more, the multifunctional phenol cured group has a lower adhesive strength with a copper foil because of its lower polarity of the resin compared with the dicyandiamide cured group.

A method for improving the adhesive property between the copper foil and the resin which has been practiced heretofore includes a copper foil treatment using a coupling agent and the like as disclosed in JPA Laid-Open No. 54-48879. However, for such hard and brittle resin groups having a higher Tg, there cannot be attained any sufficient chemical bonding therebetween merely by the treatment using commercially available coupling agents, such chemical bonding being inferior to that of conventional FR-4.

Another method for treating the copper foil with a silane coupling agent has a problem that residue remaining on the substrate after circuitry formation cause contamination in the subsequent plating process and adversary affect the adhesion with solder resists.

SUMMARY OF THE INVENTION

The present invention has been contemplated to solve these problems associated with the prior art and provide for an epoxy resin composition and a printed circuit board using the same, which features a low hygroscopic property, an excellent heat endurance and a good adhesion with copper foils.

Namely, the epoxy resin composition and the printed circuit board using the same are made of an epoxy resin composition which comprises essentially (a) an epoxy resin, (b) a multi-functional phenol group, (c) a hardening accelerator, and (d) a compound with a triazine or isocyanuric ring, or a compound which contains nitrogen 60 weight percent or less without containing a urea derivative.

Further, in the epoxy resin composition for use in the printed circuit board according to the invention, preferably, its phenol hydroxyl group in the multi-functional phenol of (b) is in a range of 0.5 to 1.5 equivalent weight relative to the epoxy group of the epoxy resin; the hardening accelerator of (c) is in a range of 0.01 to 5 weight part relative to a hundred weight part of the epoxy resin; and the compound of (d) with a triazine or isocyanuric ring, or the compound which contains nitrogen of 60 weight percent or less without containing urea derivative is contains nitrogen in a range of 0.1 to 10 weight percent relative to a solid resin part. Further, more preferably, in addition to the above (a) to (d), the epoxy resin composition of the invention contains (e) a flame-retardant agent, which is preferably a tetrabromobisphenol A or a glycidyl ether of tetrabromobisphenol A.

Still further, the epoxy resin composition for use in the printed circuit board according to the invention described above is provided as a varnish, which is impregnated into a base material, dried to provide for a prepreg, on one or both surfaces of the prepreg, a plurality of which may be laminated, a metal foil is deposited, then they are heated under pressure to form the printed circuit board.

DETAILED DESCRIPTION OF THE INVENTION

The preferred embodiments of the invention will be described in detail in the following.

The epoxy resin of (a) described above is selected from the group which includes: a bisphenol A type epoxy resin, bisphenol F type epoxy resin, bisphenol S type epoxy resin, biphenol type epoxy resin, phenol novolac type epoxy resin, crezol novolac type epoxy resin, bisphenol A novolac type epoxy resin, bisphenol F novolac type epoxy resin; phenol salicylate aldehyde novolac type epoxy resin, alicyclic epoxy resin, aliphatic chain epoxy resin, glycidyl ether type epoxy resin, and other compounds such as a bi-functional phenol group glycidyl ether compound, bi-functional alcohol glycidyl ether compound, polyphenol group glycidyl ether compound, polyphenol glycidyl ether compound and its hydride or halogenate. However, it is not limited to the above, and may be used in combination of these compounds.

The multifunctional phenol group of (b) described above is selected from the group which includes: a bisphenol F, bisphenol A, bisphenol S, polyvinyl phenol, and a novolac resin or its halogenate which is obtained by addition condensation of a phenol group such as phenol, crezol, alkylphenol, catechol, bisphenol F, bisphenol A and bisphenol S with an aldehyde group. A molecular weight of any of these compounds is not limited particularly, and it may be used in combination. A quantity of addition of its phenol hydroxyl group is preferably in a range of 0.5 to 1.5 equivalent weight relative to the epoxy group of the epoxy resin. If outside this range, a problem arises that its dielectric property and heat endurance may be deteriorated.

The hardening accelerator described above (c) may be any compound if it has a function to accelerate ether chemical reaction of the epoxy group with phenol hydrate group, which includes, for example, an alkaline metal compound, alkaline earth metal compound, imidazole compound, organic phosphorus compound, secondary amine, tertiary amine, tetra ammonium salt and the like. When an imidazole compound is used wherein its imino group is masked with acrylonitrile, isocyanate, melamine acrylate or the like, advantageously, a prepreg that has an excellent pot life stability twice or more better than that of the conventional prepreg can be provided.

The imidazole compound used here includes: imidazole, 2-ethylimidazole, 2-ethyl-4-methylimidazole, 2-phenylimidazole, 2-undecylimidazole, 1-benzyl-2-methylimidazole, 2-heptadecyl imidazole, 4,5-diphenylimidazole, 2-methylimidazoline, 2-2-phenylimidazoline, 2-undecylimidazoline, 2-heptadecylimidazoline, 2-isopropylimidazole, 2,4-dimethyl imidazole, 2-phenyl-4-methylimidazole, 2-ethylimidazoline, 2-isopropylimidazoline, 2,4-dimethylimidazoline, 2-phenyl-4-methylimidazoline and the like. The masking agent includes acrylonitrile, phenylen diisocyanate, toluene diisocyanate, napthalen diisocyanate, methyl bisphenyl isocyanate, isophorone diisocyanate, melamine isocyanate and the like. This hardening accelerator may be used in combination. A quantity thereof is preferably in a range of 0.01 to 5 weight part with respect to a hundred weight part of the epoxy resin. At 0.01 weight part or less thereof, its acceleration effect becomes negligible, and at more than 5 weight part thereof, the pot life stability deteriorates. deteriorates.

The compound of (d) having triazine ring or isocyanuric ring, or the compound containing nitrogen less than 60 weight percent without containing urea derivative includes, for example, an aromatic amine type epoxy resin, aliphatic amine type epoxy resin, hydantoin type epoxy resin, glycidyl amine type epoxy resin, isocyanurate type epoxy resin, cyanurate group, isocyanurate group, melamine group, an addition condensate of phenol group, a compound having a triazine ring, and aldehyde group, and glycidyl ether thereof, however, it is not limited thereto. These compounds may be of any type or may be used in combination. Preferably, a nitrogen content contained in these compounds is in a range of 0.1 to 10 weight percent compared to a whole solid resin part of the epoxy resin composition used in the printed circuit board. At less than 0.1 weight percent of the nitrogen content, it is difficult to improve the adhesive strength with the copper foil, and at excess of 10 weight percent thereof, the water absorption rate increases.

The flame retardant agent of (e) described above may be of any type of flame retardant agents commercially available, which includes, for example, a haloganate compound of any of the following: a bisphenol A type epoxy resin, bisphenol F type epoxy resin, bisphenol S type epoxy resin, phenol novolac type epoxy resin, crezol novolac type epoxy resin, bisphenol A novolac type epoxy resin, bisphenol F novolac type epoxy resin, phenol salicylic aldehyde novolac type epoxy resin, cyclic aliphatic epoxy resin, aliphatic chain epoxy resin, glycidyl esther type epoxy resin, and other haloganate compounds of bisphenol A, bisphenol F, bisphenol S, polyvinyl phenol, or those of the phenol group including phenol, crezole, alkylphenol, catechol, bisphenol with a novolac resin of aldehyde group. However, it is not limited thereto, and an antimonious trioxide, tetraphenyl phosphine or the like may be used in combination as well.

When applying or impregnating the epoxy resin composition for use in the printed circuit board into the base material, a solvent may be used. Such solvents include acetone, methylethyl ketone, toluene, xylene, methyl isobuthyl ketone, ethyl acetate, ethylene glycol monomethylether, N, N-dimethyl acetoamide, methanol, ethanol and the like, and these may be used in combination.

The varnish using the epoxy resin composition for use in the printed circuit board obtained by blending the above-mentioned materials from (a) to (e) is impregnated into a base material such as a glass fiber, unwoven glass cloth or paper, or into any cloth without using glass, then dried in an oven at temperatures in a range from 80 to 200° C., thereby obtaining a prepreg of the epoxy resin composition for use in the printed circuit board. The prepreg is heated under pressure at temperatures from 150 to 250° C. and at 20 to 80 Kgf/cm$^2$ for 0.3 to 3 hours, which is then used to manufacture a printed circuit board or a metal-clad laminate.

The process of heating of the prepreg is provided for removing the solvent when it is used, and for eliminating the fluidity at room temperatures when the solvent is not used.

The epoxy resin composition and the printed circuit board using the same are provided according to the invention, which feature a low water absorption, a high heat endurance and an improved adhesion with copper foils, wherein the epoxy resin composition is comprised of (a) an epoxy resin, (b) a multifunctional phenol group, (c) a hardening accelerator, and (d) a compound having a triazine ring or isocyanuric ring, or a compound containing nitrogen at 60 weight percent or less without containing urea derivatives.

DESCRIPTION OF THE PREFERRED EMBODIMENTS

The invention will be set forth in detail according to the preferred embodiments described in the following, however, the scope of the invention is not limited thereto.

EMBODIMENT 1

A varnish using an epoxy resin composition for use in the printed circuit board is manufactured, wherein the epoxy resin composition is comprised of: (a) 100 weight part of a bisphenol A novolac type epoxy resin (make of the Dainippon Ink and Chemicals Inc., Epicron N-865 (trade name); epoxy equivalent weight, 207) as its epoxy resin; (b) 24 weight part of a phenol novolac resin (make of Hitachi Chemical Co., Ltd., HP-850N (trade name), hydroxyl group equivalent weight of 108) as its multifunctional phenol group, (c) 0.3 weight part of 1-cyanoethyl-2-ethyl-4-methylimidazole as its hardening accelerator; and (d) 33.5 weight part of a melamine-modified phenol novolac resin (make of Dainippon Ink and Chemicals Inc., Phenolite LA-7054 (trade name), nitrogen content of 14 weight percent) as its compound having a triazine ring or isocyanurate ring, or of its compound containing nitrogen at 60 weight % or less without containing a urea derivative, and wherein these materials are dissolved in methylethylketone so as to provide a varnish of the epoxy resin composition for the printed circuit board, having 70 weight % of a nonvolatile part.

EMBODIMENT 2

A varnish of an epoxy resin composition for the printed circuit board according to embodiment 2 of the invention is provided, comprising: 100 weight part of a bisphenol A novolac type epoxy resin (make of Dainippon Ink and Chemicals Inc., Epicron N-865 (trade name), epoxy equivalent weight of 207); 22.6 weight part of phenol novolac resin (make of Hitachi Chemical Co.,Ltd., HP-850N (tradename), hydroxyl group equivalent weight of 108); 12.9 weight part of melamine-modified phenol novolac resin (make of Dainippon Ink and Chemicals Inc., Phenolite LA-7054 (trade name), nitrogen content of 14 weight percent); 46.8 weight part of tetra bromobisphenol A (make of Teijin Chemical Ltd., Fireguard FG-2000 (trade name), hydroxyl group equivalent weight of 272, bromine content of 58 weight percent); and 0.3 weight part of 1-cyanoethyl-2-ethyl-4-methylimidazole, and wherein these materials are dissolved in methylethylketone to provide for the varnish having 70 weight percent of a non-volatile part.

EMBODIMENT 3

A varnish using an epoxy resin composition for the printed circuit board according to embodiment 3 of the invention is provided, comprising: 100 weight part of the bisphenol A novolac type epoxy resin (make of Dainippon Ink and Chemicals Inc. Epicron N-865 (trade name), epoxy equivalent weight of 207); 5.8 weight part of phenol novolac resin (make of Hitachi Chemical Co, Ltd., HP-850N (trade name), hydroxyl group equivalent weight of 108); 31.1 weight part of benzoguanamine-modified phenol novolac (Dainippon Ink and Chemicals Inc., Phenorite LA-7054V (trade name), nitrogen content of 7 weight percent); 47.6 weight part of tetrabromobisphenol A (Teijin Chemical Ltd., FireGuard FG-2000 (trade mark), hydroxyl group equivalent weight of 272, bromine content of 58 weight percent); and 0.3 weight part of 1-cyanoethyl-4-methyl imidazole, wherein these materials are dissolved in methylethyl ketone to provide for the varnish having 70 weight percent of a non-volatile part.

EMBODIMENT 4

A varnish using an epoxy resin composition according to an embodiment 4 of the invention suitable for use in the printed circuit board is provided, comprising: 100 weight part of bromine bisphenol A type epoxy resin (Sumitomo Chemical Co, Ltd. Sumiepoxy ESB400T (trade name), epoxy equivalent weight of 400, bromine content of 49 weight percent); 19.5 weight part of phenol novolac resin (Hitachi Chemical Co, Ltd., HP=850N (trade name), hydroxyl group equivalent weight of 108); 9 weight part of melamine-modified phenol novolac resin (Dainippon Ink and Chemicals Inc., PhenoriteLA-7054 (trade name), nitrogen content of 14 weight percent); and 0.3 weight part of 1-cyanoethyl- 2-ethyl-4-methylimidazole, wherein these materials are dissolved in methylethylketone to provide for the varnish having 70 weight percent of a non-volatile part.

EMBODIMENT 5

A varnish using an epoxy resin composition suitable for use in the printed circuit board according to an embodiment 5 of the invention is provided, comprising: 100 weight part of bisphenol A novolac type epoxy resin (Dainippon Ink and Chemicals Inc., EpicronN-865,epoxy equivalent weight of 207); 33.6 weight part of phenol novolac resin (Hitachi Chemical Co, Ltd., HP-850N, hydroxyl group equivalent weight of 108); 46.7 weight part of tetrabromobisphenol A (Teijin Chemicals Ltd., FireGuard FG-2000,hydroxyl group equivalent weight of 272,bromine content of 58 weight percent), 31.9 weight part of melamine (nitrogen content of 66.7 weight percent); and 0.3 weight part of 1-cyanoethyl-2-ethyl-4-methylimidazole, wherein these materials are dissolved in methylethyl ketone to provide for the varnish having 70 weight percent of a non-volatile part.

COMPARISON EXAMPLE 1

A varnish using an epoxy resin composition for the printed circuit board is provided as a comparison example 1, the same comprising: 100 weight part of the bisphenol A novolac type epoxy resin (Dainippon Ink and Chemicals Inc., Epicron N-865 (trade name), epoxy equivalent weight of 207); 33.6 weight part of phenol novolac resin (Hitachi Chemical Co, Ltd., HP-850N (trade name), hydroxyl group equivalent weight of 108); 46.7 weight part of tetrabromobisphenol A (Teijin Chemicals Ltd., FireGuard FG-2000 (trade name), hydroxyl group equivalent weight of 272, bromine content of 58 weight percent); and 0.3 weight part of 1-cyanoethyl-2-ethyl-4-methylimidazole, wherein these materials are dissolved in methylethylketone to provide for the varnish having 70 weight percent of a non-volatile part.

COMPARISON EXAMPLE 2

A varnish using an epoxy resin composition for the printed circuit board is provided as comparison example 2, the same comprising: 100 weight part of the bisphenol A novolac type epoxy resin (Dainippon Ink and Chemicals Inc., Epicron N-865 (trade name), epoxy equivalent weight of 207); 61.4 weight part of melamine-modified phenol novolac resin (Dainippon Ink and Chemicals Inc., PhenoriteLA-7054 (trade name), nitrogen content of 14 weight percent); and 0.3 weight part of 1-cyanoethyl-2-ethyl-4-methylimidazole, wherein these materials are dissolved in methylethylketone to provide for the varnish having 70 weight percent of a non-volatile part.

COMPARISON EXAMPLE 3

A varnish using an epoxy resin composition for the printed circuit board is provided as comparison example 3, the same comprising: 100 weight part of the bisphenol A novolac type epoxy resin (Dainippon Ink and Chemicals Inc., Epicron N-865 (trade name), epoxy equivalent weight of 207); 38.7 weight part of melamine-modified phenol novolac resin (Dainippon Ink and Chemicals Inc., PhenoriteLA-7054 (trade name), nitrogen content of 14 weight percent); 48.5 weight part of tetrabromobisphenol A (Teijin Chemicals Ltd., FireGuard FG-2000,hydroxyl group equivalent weight of 272,bromine content of 58 weight percent); and 0.3 weight part of 1-cyanoethyl-2-ethyl-4-methylimidazole, wherein these materials are dissolved in methylethylketone to provide for the varnish having 70 weight percent of a non-volatile part.

COMPARISON EXAMPLE 4

A varnish using an epoxy resin composition for the printed circuit board is provided as comparison example 4, the same comprising: 80 weight part of a low bromine epoxy resin (Dow Chemical Japan Ltd., DER-518 (trade name) with a bromine content of 21 weight percent and epoxy equivalent weight of 485); 20 weight part of o-cresol novolac type epoxy resin (Dainippon Ink and Chemicals Inc., EpicronN-673 (trade name), epoxy equivalent weight of 213); 1 weight part of dicyandiamide which is dissolved in 2-methyletanol in advance prior to blending; and 0.2 weight part of 1-cyanoethyl-2-ethyl-4-methylimidazole as a hardening accelerator, wherein these materials are dissolved in 2-methyletanol and methylethylketone to provide for the varnish having 65 weight percent of a non-volatile part.

Respective compositions of epoxy resins for use in the printed circuit board according to the embodiments 1–5 and comparison examples 1–4 are shown in Table 1. Nitrogen contents in Table 1 indicate respective contents of nitrogen with respect to a solid portion of the resin.

TABLE 1

|  | EMBODIMENTS | | | | | COMPARISON EXAMPLES | | | |
| --- | --- | --- | --- | --- | --- | --- | --- | --- | --- |
| ITEM | 1 | 2 | 3 | 4 | 5 | 1 | 2 | 3 | 4 |
| N865 | 100 | 100 | 100 | — | 100 | 100 | 100 | 100 | — |
| ESB 400T | — | — | — | 100 | — | — | — | — | — |
| DER518 | — | — | — | — | — | — | — | — | 80 |
| N637 | — | — | — | — | — | — | — | — | 20 |
| HP850N | 24.0 | 22.6 | 5.8 | 19.5 | 33.6 | 33.6 | — | — | — |
| LA7054 | 33.5 | 12.9 | — | 9.0 | — | — | 61.4 | 38.7 | — |
| LA7054V | — | — | 31.1 | — | — | — | — | — | — |
| Melamine | — | — | — | — | 31.9 | — | — | — | — |
| TBA | — | 46.8 | 47.6 | — | 46.7 | 46.7 | — | 48.5 | — |
| Dicy | — | — | — | — | — | — | — | — | 1 |
| 2E4MZ-CN | 0.3 | 0.3 | 0.3 | 0.3 | 0.3 | 0.3 | 0.3 | 0.3 | 0.2 |
| MEK | 67 | 78 | 79 | 55 | 56 | 77 | 69 | 80 | 54 |
| MG | — | — | — | — | — | — | — | — | 54 |
| Nitrogen content (weight percent) | 3 | 1 | 1 | 1 | 10 | 0 | 5.3 | 2.9 | 0.66 |

Each varnish obtained using respective epoxy resin compositions for the printed circuit board according to embodiments 1–5 and comparison examples 1–4 is impregnated into a glass cloth of 0.2 mm thick, heated at 160° C. for 2–5 minutes to obtain a prepreg. Four sheets of the prepregs obtained above are laminated, and a copper foil of 18 μm thick is overlaid on both surfaces thereof, then, they are heated and pressed at 175° C., 2.5 Mpa for 90 minutes in order to manufacture a copper clad laminate on both surfaces thereof. Respective tests of Tg, copper foil peel strength, solder heat endurance and water absorption are carried out on these copper foil clad laminates obtained above. The results of these tests are shown in Tables 2 and 3.

The method of carrying out these testing is as follows.

Tg: After etching of the copper foil, it was measured by the thermal mechanical analysis (TMA).

Copper foil peel-off strength: A line of 10 mm width is etched on the laminate, then peel-off strengths of the copper foil are measured under normal condition and at 200° C. using a tensile tester by applying a tensile strength of 50 mm/minute in a vertical direction.

Soldering heat endurance: After etching the copper foil, holding in a pressure cooker tester for 2 hours, and immersing in a solder of 260° C. for 20 seconds, visual appearance observation is carried out. Symbol "○" in the Tables indicates that there occurred no measling nor bulging verifying no existence of any abnormality, symbol "Δ" indicates existence of a measling, and symbol "X" indicates existence of a bulging.

Water absorption rate: calculated from a difference in weights measured prior to and after the immersion of the samples subjected to etching of the copper foils, in the pressure cooker tester for 4 hours.

TABLE 2

| ITEM | EMBD. 1 | EMBD. 2 | EMBD. 3 | EMBD. 4 | EMBD. 5 |
| --- | --- | --- | --- | --- | --- |
| Tg (° C.) | 167 | 170 | 168 | 141 | 175 |
| Peel-off [nor.] | 1.5 | 1.5 | 1.5 | 1.5 | 1.5 |
| Str. (KN/m) [200° C.] | 0.7 | 0.7 | 0.7 | 0.7 | 0.8 |
| Solder heat endurance | ○ | ○ | ○ | ○ | ○ |
| Water Absorp. (weight percent) | 0.6 | 0.5 | 0.5 | 0.4 | 0.6 |

| ITEM | COMP. 1 | COMP. 2 | COMP. 3 | COMP. 4 |
| --- | --- | --- | --- | --- |
| Tg (° C.) | 174 | 165 | 160 | 120 |
| Peel-off [nor.] | 1.3 | 1.5 | 1.5 | 1.6 |
| Str. (KN/m) [200° C.] | 0.4 | 0.7 | 0.7 | 0.1 |
| Solder heat endurance | ○ | Δ | Δ | X |
| Water Absorp. (weight percent) | 0.5 | 0.7 | 0.6 | 1.2 |

TABLE 2

| ITEM | COMP. 1 | COMP. 2 | COMP. 3 | COMP. 4 |
| --- | --- | --- | --- | --- |
| Tg (° C.) | 174 | 165 | 160 | 120 |
| Peel-off [nor.] | 1.3 | 1.5 | 1.5 | 1.6 |

TABLE 2-continued

| ITEM | COMP. 1 | COMP. 2 | COMP. 3 | COMP. 4 |
|---|---|---|---|---|
| Str. (KN/m) [200° C.] | 0.4 | 0.7 | 0.7 | 0.1 |
| Solder heat endurance | ◯ | Δ | Δ | X |
| Water Absorp. (weight percent) | 0.5 | 0.7 | 0.6 | 1.2 |

The embodiments 1–5 of the invention which use the compound having a triazine or isocyanuric ring, or the compound which contains nitrogen less than 60 weight percent and does not contain a urea derivative have improved copper foil peel-off strengths as high as 1.5 kN/m in normal conditions, and retain approximately a half of their peel-off strengths of the normal conditions even at 2000° C., thereby less deteriorating at high temperatures. Further, because the embodiments 1–5 of the invention utilize the phenol novolac resin as the hardening agent, they feature a high Tg as high as 140–1750° C., thereby having an improved soldering heat endurance, and a low water absorption rate.

In contrast, the comparison example 1 which does not combine the compound which has the triazine or isocyanurate ring, or the compound which contains nitrogen less than 60 weight percent without containing the urea derivative has smaller copper foil peel-off strengths both in the normal condition and at 2000° C. Comparison examples 2 and 3 which do not use phenol novolac as the hardening agent, are inferior in the heat endurance. Further, comparison example 4 which uses dicyandiamide has a low Tg, and a low copper foil peel-off strength at 2000° C. Still further, the same has a large water absorption rate, and inferior heat endurance compared to those of the embodiments.

The epoxy resin composition according to the invention and the printed circuit board using the same feature a low water absorption property, a high heat endurance, and an improved adhesion strength with copper foils. Thereby, they can be advantageously applied to a high Tg printed circuit board having an excellent heat endurance required for ensuring a substantially improved connection reliability in the printed circuit board or module mount printed circuit board for installing a microprocessor unit.

What is claimed is:

1. An epoxy resin composition for a printed circuit board, comprising:
    a novolac type epoxy resin;
    a multi-functional phenol group;
    a hardening accelerator; and
    an addition condensate between a phenolic compound, a compound having a triazine ring, and an aldehyde compound.

2. An epoxy resin composition according to claim 1, wherein said multi-functional phenol group contains a phenol hydroxyl group in a range of 0.5–1.5 equivalent weight relative to an epoxy group of said epoxy resin.

3. An epoxy resin composition according to claim 1, wherein said hardening accelerator is in a range of 0.01–5 weight part relative to 100 weight part of said epoxy resin.

4. An epoxy resin composition according to claim 1, further comprising a flame retardant agent.

5. An epoxy resin composition according to claim 4, wherein said flame retardant agent is at least one of tetrabromobisphenol A and a glicidylether of the tetrabromobisphenol A.

6. The epoxy resin composition according to claim 1, wherein the novolac type epoxy resin is selected from the group consisting of phenol novolac, crezol novolac, bisphenol A novolac, bisphenol F novolac, and phenol salicylate aldehyde novolac.

7. The epoxy resin composition according to claim 1, wherein said epoxy resin composition has a glass transition temperature of 140 to 175° C.

8. A method of making a printed circuit board, comprising:
    preparing a varnish comprising an epoxy resin composition;
    impregnating a base material with said varnish;
    drying said impregnated base material to form a prepreg;
    depositing a metal foil on at least one surface of said prepreg to form a metal clad laminate; and
    heating said metal clad laminate under pressure to form the printed circuit board,
    wherein said epoxy resin composition comprises:
        a novolac type epoxy resin;
        a multi-functional phenol group;
        a hardening accelerator; and
        an addition condensate between a phenolic compound, a compound having a triazine ring, and an aldehyde compound.

9. A method of making a printed circuit board according to claim 8, wherein the metal foil is a copper foil.

10. A printed circuit board comprising the epoxy resin composition of claim 9.

11. An epoxy resin according to claim 6, wherein the novolac epoxy resin is a bisphenol A novolac epoxy resin.

12. A method according to claim 8, wherein the novolac type epoxy resin is selected from the group consisting of phenol novolac, crezol novolac, bisphenol A novolac, bisphenol F novolac, and phenol salicylate aldehyde novolac.

13. A method according to claim 12, wherein the novolac epoxy resin is a bisphenol A novolac epoxy resin.

* * * * *